United States Patent
Yamamoto

(10) Patent No.: US 9,595,567 B2
(45) Date of Patent: Mar. 14, 2017

(54) SEMICONDUCTOR MEMORY DEVICE WITH RESISTANCE CHANGE FILM AND METHOD OF MANUFACTURING THE SAME

(75) Inventor: Kazuhiko Yamamoto, Yokohama (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 782 days.

(21) Appl. No.: 13/585,141

(22) Filed: Aug. 14, 2012

(65) Prior Publication Data

US 2013/0248801 A1    Sep. 26, 2013

(30) Foreign Application Priority Data

Mar. 21, 2012  (JP) ................ 2012-064244

(51) Int. Cl.
   *H01L 29/49* (2006.01)
   *H01L 27/24* (2006.01)
   *H01L 29/40* (2006.01)
   *H01L 45/00* (2006.01)

(52) U.S. Cl.
   CPC ........... *H01L 27/249* (2013.01); *H01L 45/08* (2013.01); *H01L 45/1226* (2013.01); *H01L 45/146* (2013.01); *H01L 45/1616* (2013.01)

(58) Field of Classification Search
   CPC ................................................ G11C 13/0002
   See application file for complete search history.

(56) References Cited

U.S. PATENT DOCUMENTS

| | | | |
|---|---|---|---|
| 7,910,914 B2* | 3/2011 | Tanaka | G11C 5/025 257/5 |
| 8,120,006 B2* | 2/2012 | Kim | H01L 45/04 257/296 |
| 8,124,968 B2* | 2/2012 | Koo | H01L 27/101 257/4 |
| 8,710,484 B2* | 4/2014 | Wei | H01L 45/08 257/4 |

(Continued)

FOREIGN PATENT DOCUMENTS

| | | |
|---|---|---|
| JP | 2011-129639 | 6/2011 |
| JP | 2011-146632 | 7/2011 |

*Primary Examiner* — Michael Shingleton
(74) *Attorney, Agent, or Firm* — Oblon, McClelland, Maier & Neustadt, L.L.P.

(57) ABSTRACT

According to one embodiment, a semiconductor memory device includes a semiconductor substrate, a plurality of insulating layers, a plurality of first interconnection layers, a plurality of second interconnection layers, a plurality of memory cells, and a resistance change film. The insulating layers and first interconnection layers are arranged in parallel with the semiconductor substrate. The second interconnection layers are arranged so as to intersect the first interconnection layers. The second interconnection layers are arranged perpendicular to the semiconductor substrate. The memory cells are arranged at intersections of the first and second interconnection layers. Each of the memory cells includes the resistance change film arranged between the first and second interconnection layers. The side of the first interconnection layer in contact with the resistance change film is retreated more in a direction to separate from the second interconnection layer than the side of the insulating layer.

8 Claims, 17 Drawing Sheets

(56) References Cited

U.S. PATENT DOCUMENTS

| | | | | |
|---|---|---|---|---|
| 8,912,521 | B2* | 12/2014 | Nojiri | H01L 27/2454 |
| | | | | 257/2 |
| 8,971,092 | B2* | 3/2015 | Kobayashi | H01L 27/2454 |
| | | | | 365/148 |
| 9,397,144 | B2 | 7/2016 | Nansei | |
| 2009/0251963 | A1* | 10/2009 | Seol | G11C 16/0483 |
| | | | | 365/185.05 |
| 2009/0321878 | A1* | 12/2009 | Koo | H01L 27/101 |
| | | | | 257/536 |
| 2010/0019218 | A1 | 1/2010 | Chung | |
| 2011/0049646 | A1* | 3/2011 | Lim | H01L 21/28556 |
| | | | | 257/410 |
| 2011/0140068 | A1* | 6/2011 | Ozawa | H01L 27/249 |
| | | | | 257/4 |
| 2011/0175048 | A1* | 7/2011 | Sekine | H01L 27/2409 |
| | | | | 257/2 |
| 2011/0309319 | A1* | 12/2011 | Quick | H01L 27/249 |
| | | | | 257/4 |
| 2012/0286226 | A1* | 11/2012 | Seong | H01L 45/04 |
| | | | | 257/3 |
| 2014/0361239 | A1* | 12/2014 | Ramaswamy | H01L 27/249 |
| | | | | 257/5 |
| 2015/0179704 | A1* | 6/2015 | Yoshida | H01L 27/249 |
| | | | | 257/5 |

* cited by examiner

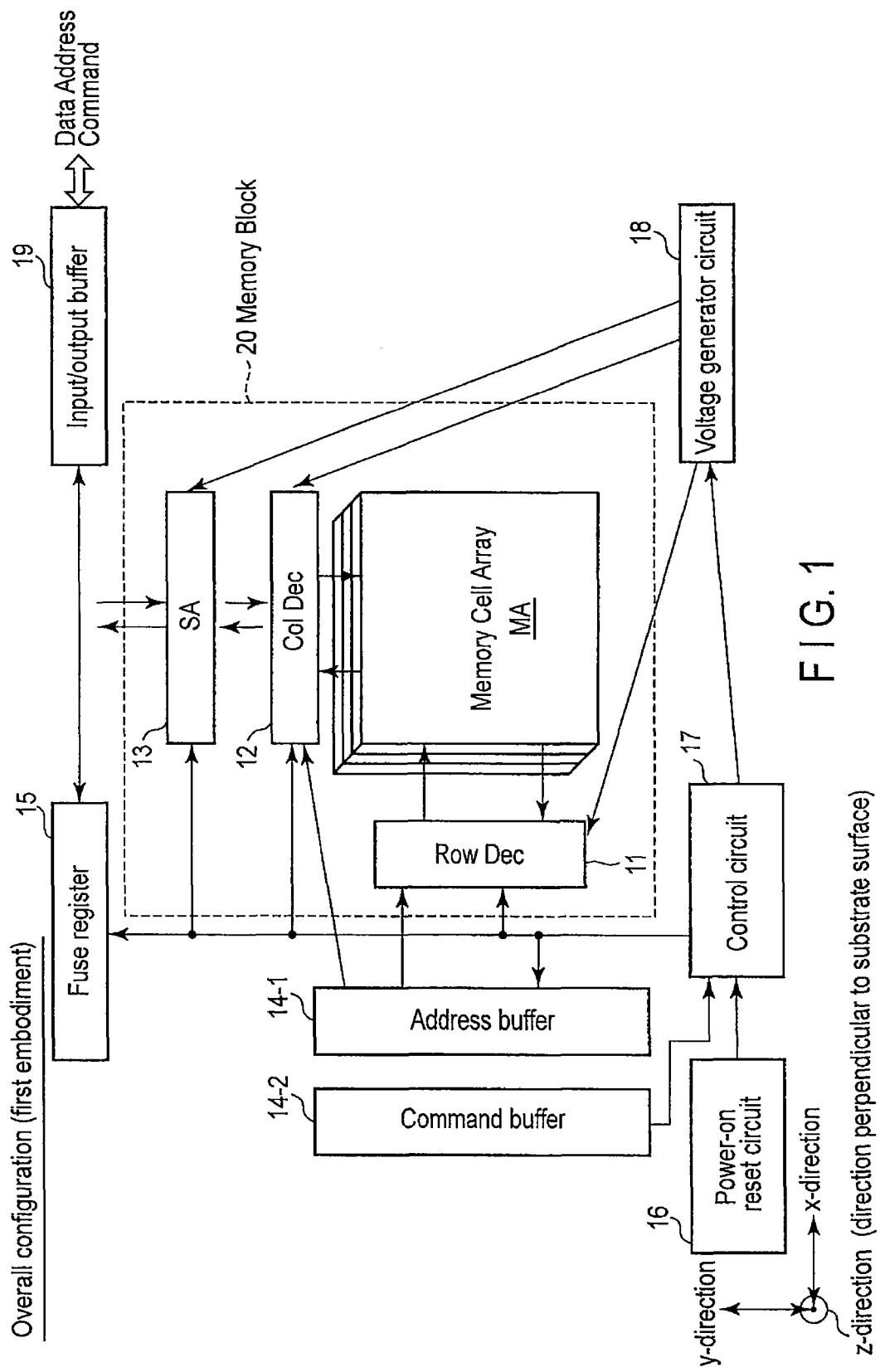
F I G. 1

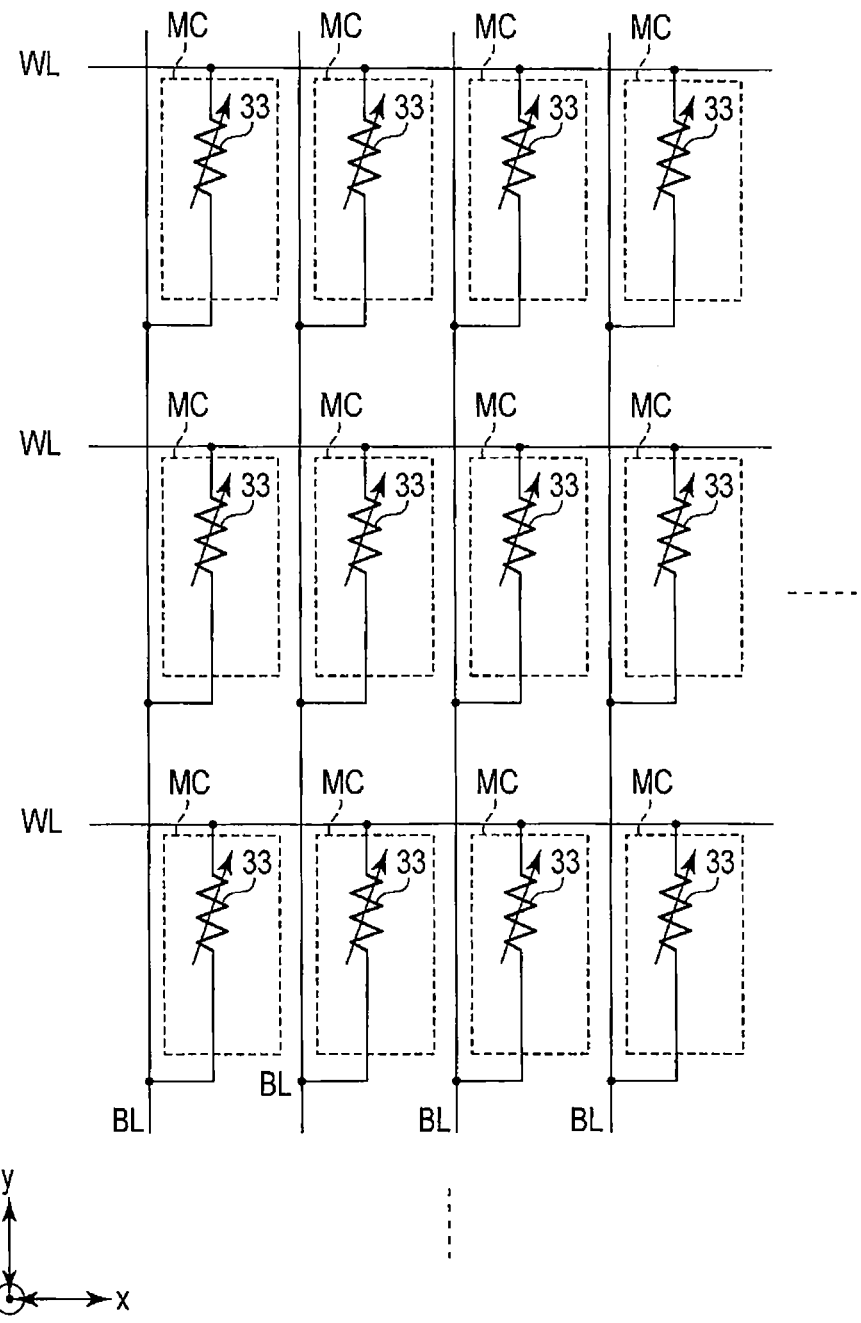
F I G. 3

Reference example

First embodiment

Manufacturing method (first embodiment)

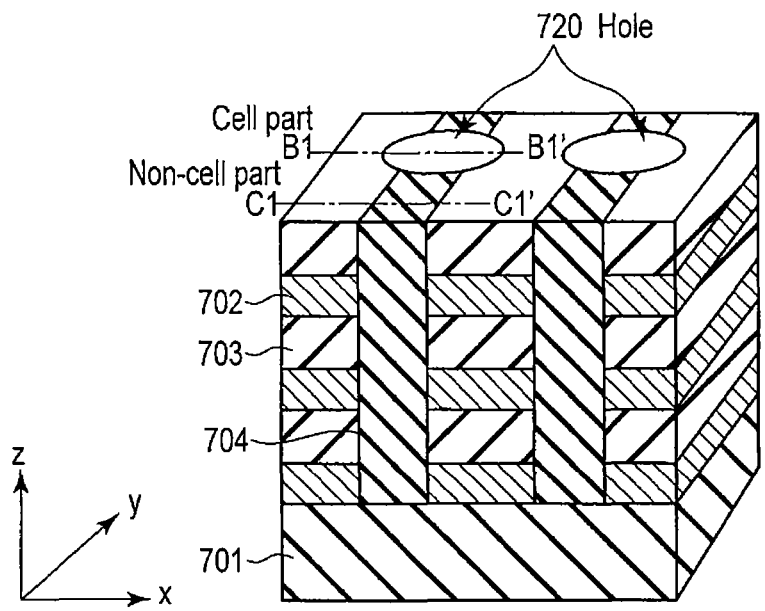
F I G. 10
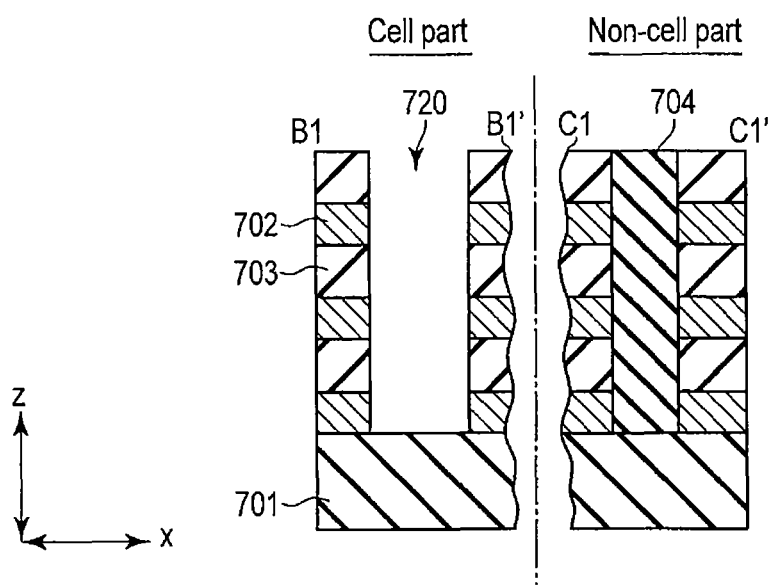
F I G. 11A    F I G. 11B

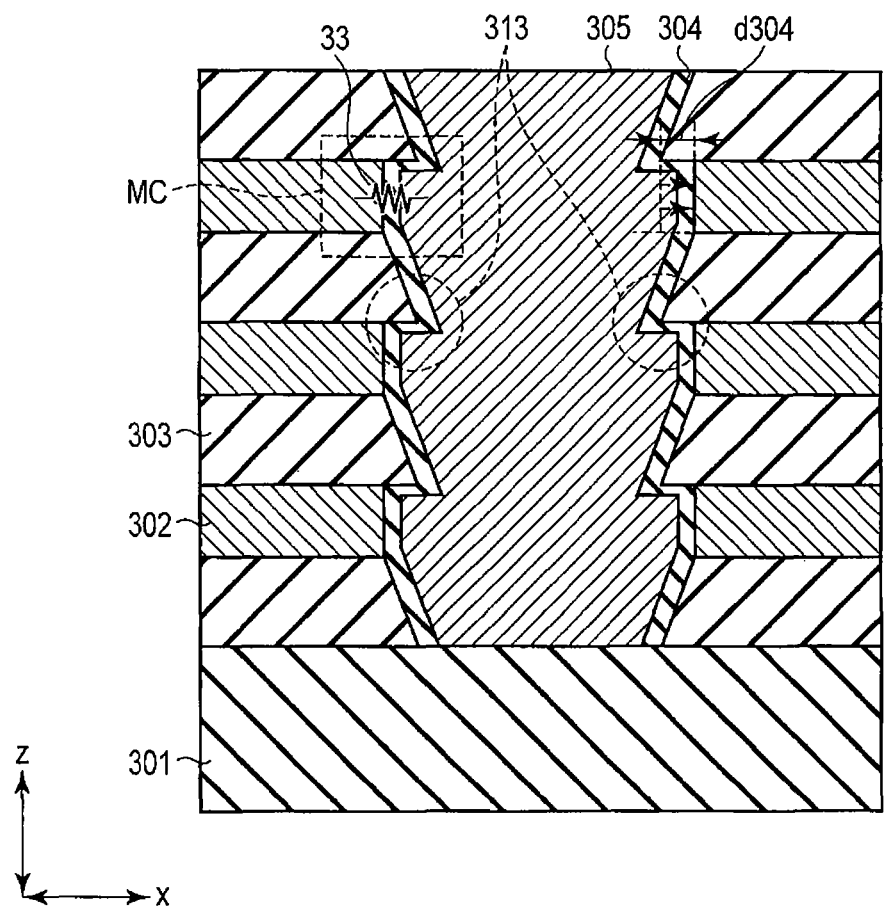
F I G. 15

Fifth embodiment
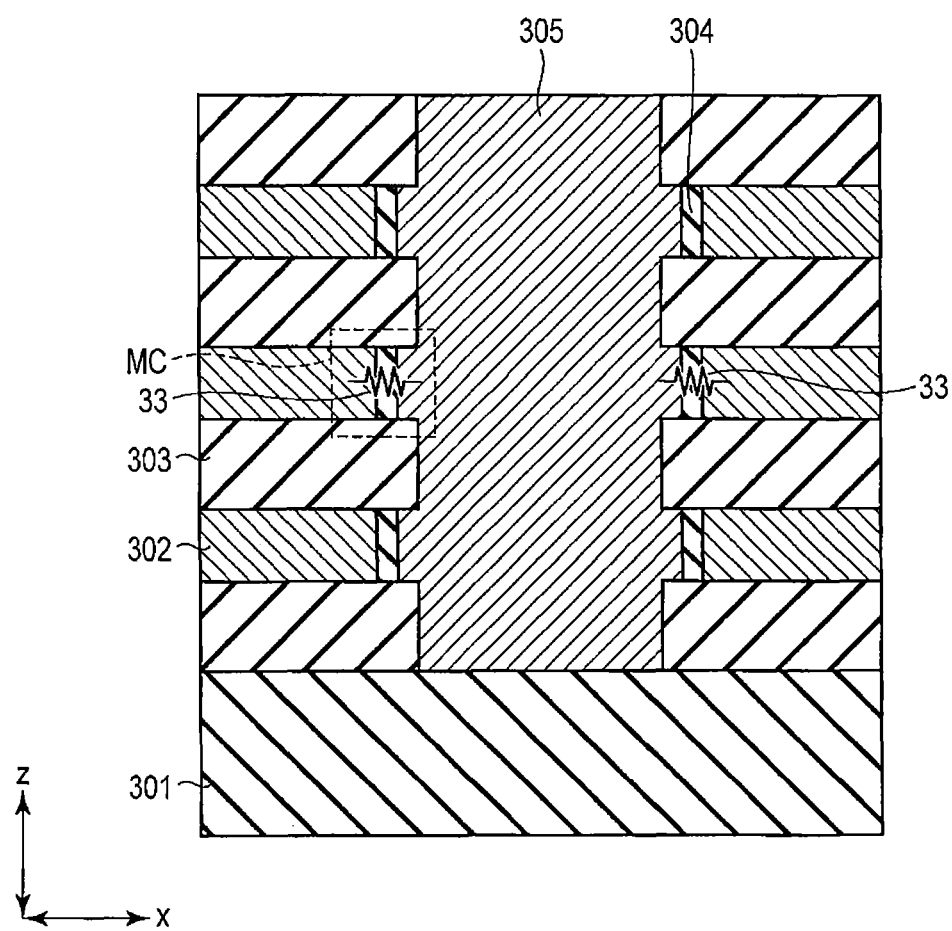
F I G. 20

SEMICONDUCTOR MEMORY DEVICE WITH RESISTANCE CHANGE FILM AND METHOD OF MANUFACTURING THE SAME

CROSS-REFERENCE TO RELATED APPLICATIONS

This application is based upon and claims the benefit of priority from Japanese Patent Application No. 2012-064244, filed Mar. 21, 2012, the entire contents of which are incorporated herein by reference.

FIELD

Embodiments described herein relate generally to a semiconductor memory device with, for example, a resistance change film and a method of manufacturing the same.

BACKGROUND

In general, a memory cell used in a nonvolatile memory has used the charge amount accumulated at a floating gate electrode as information and read the accumulated charge amount as a change in the threshold value of a transistor.

However, when the element area is decreased to improve the performance by reducing chip costs, the charge amount capable of being accumulated in a memory cell decreases. Therefore, it becomes difficult to obtain a voltage difference capable of being sensed sufficiently from the memory cell. Accordingly, the limitations of device scaling have begun to be seen. Therefore, a three-dimensional cell structure has been considered which can not only reduce the area of elements in a conventional plane but also increase the number of mounted elements per unit area by also stacking cells vertically.

Memory cells have used a transistor structure with three terminals as a basic one. However, use of two-terminal elements, such as variable resistive elements, enables further miniaturization of elements to be expected. Variable resistive elements include metal-oxide resistance change memories (ReRAMs), phase-change memories, and conductive bridge memories. Memory cells use the resistance value state of a variable resistive element sandwiched between two terminals as information.

The resistance change memory is a memory that stores information by the generation or disappearance of a filament path formed in a metal oxide film. The metal oxide film has insulation properties immediately after a film formation. However, when a large current is caused to flow by applying a high voltage to the metal oxide film, a microscopic path in which current flows easily in a local part, that is, a so-called filament path, is formed. Generally, it is thought that the composition of a filament path becomes electrically conductive when the path includes excessive metal and that, when a voltage is further applied to the path, oxygen moves depending on conditions, with the result that the path is stabilized, recovering the insulation properties.

In the phase change memory and conductive bridge memory, when the conductive properties in a conductive path and at the path end change, the resistance value of the entire element changes. Particularly in a nonvolatile memory, it is important to repeat a conductive change stably and maintain the conductive change state for a long time stably. To achieve this, it is necessary to control the size of the conductive path, its position, and others.

To realize this, it is necessary to optimize a film forming process itself by uniformizing the film thickness and composition of films constituting a resistance change memory, control a grain size and a shape in the case of crystallization, and prevent impurities from mixing in.

In addition to the above films, the optimization of a cell structure that makes it easier to control a conductive path is desired.

BRIEF DESCRIPTION OF THE DRAWINGS

FIG. 1 is a block diagram showing an overall configuration of a semiconductor memory device according to a first embodiment;

FIG. 3 is an equivalent circuit diagram of the memory cell array of FIG. 1;

FIG. 10 is a diagram to explain a step of manufacturing the semiconductor memory device according to the first embodiment;

FIGS. 11A and 11B are diagrams to explain a step of manufacturing the semiconductor memory device according to the first embodiment, FIG. 11A being a sectional view of a hole 720 part (cell part) taken along line B1-B1' of FIG. 10, and FIG. 11B being a sectional view of a non-cell part taken along line C1-C1' of FIG. 10;

FIG. 15 is a sectional view of a memory cell array according to a second embodiment;

FIG. 20 is a sectional view of a memory cell array according to a fifth embodiment.

DETAILED DESCRIPTION

Figure 2:
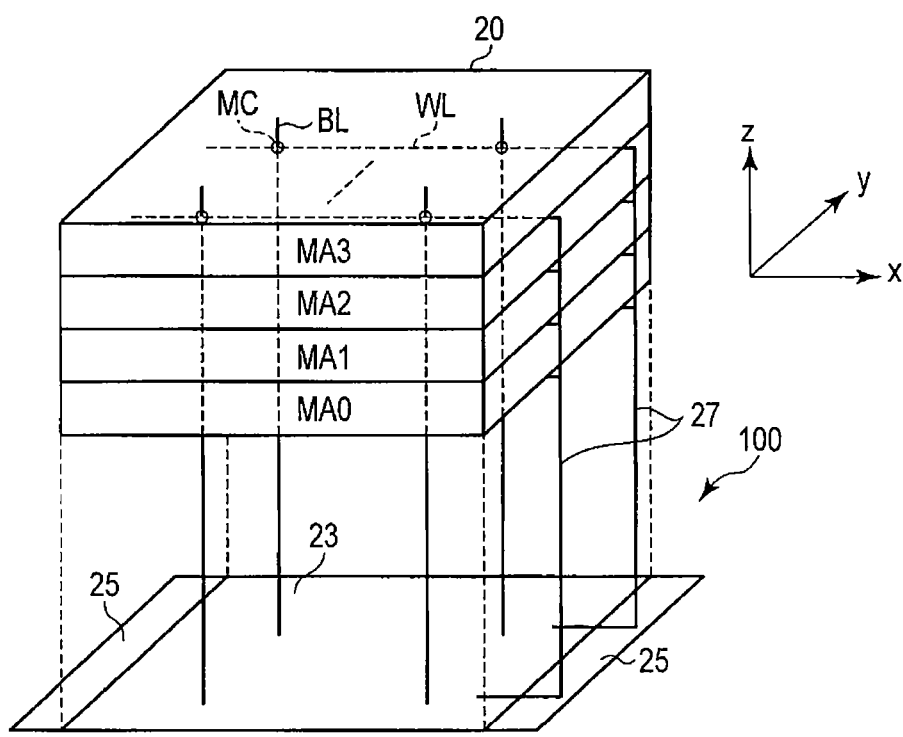
FIG. 2 is a perspective view showing a three-dimensional configuration of the memory block of FIG. 1.

In general, according to one embodiment, a semiconductor memory device includes a semiconductor substrate, a plurality of insulating layers, a plurality of first interconnection layers, a plurality of second interconnection layers, a plurality of memory cells, and a resistance change film. The insulating layers and first interconnection layers are stacked one on top of another above the semiconductor substrate. The insulating layers and first interconnection layers are arranged in parallel with the semiconductor substrate. The second interconnection layers are arranged so as to intersect the first interconnection layers. The second interconnection layers are arranged perpendicular to the semiconductor substrate. The memory cells are arranged at intersections of the first and second interconnection layers. Each of the memory cells includes the resistance change film arranged between the first and second interconnection layers. The side of the first interconnection layer in contact with the resistance change film is retreated more in a direction to separate from the second interconnection layer than the side of the insulating layer.

Reference Example

For comparison with embodiments described below, a reference example will be explained.

First, a two-terminal resistance change element configured to include a resistance change layer and an upper and a lower electrode that sandwich the resistance change layer between them is taken as an example. Until now, a structure where a lower electrode layer, a resistance change layer, and an upper electrode layer are stacked one on top of another in parallel with a substrate surface and current flows in a direction perpendicular to the substrate surface has been the mainstream. To increase the capacity of such an element, it is necessary to stack a lower electrode, a resistance change film, and an upper electrode one on top of another repeatedly. However, it has been difficult not only to form a resistance change film and its interface, while controlling them in a plurality of layers stably, but also to stabilize the characteristics of the element.

Accordingly, a resistance change film is formed on the sidewalls of a conductive film to act as an electrode and an insulating film stacked layer that isolates the conductive film, thereby avoiding the process of stacking an electrode and a resistance change film repeatedly. In this case, an electrode, a resistance change film, and an electrode are configured to be stacked one on top of another in parallel with the substrate surface, with current flowing in a cell in parallel with the substrate surface.

With this configuration, to miniaturize the cell structure in a lateral direction (or in a horizontal direction with respect to the substrate surface), a trench separating adjacent cells or the distance between holes needs to be narrowed. In this case, however, it is difficult to embed both of a resistance change film and an electrode in a narrow trench or in a hole with high coverage. If a film cannot be formed uniformly, a film thickness difference occurs between the top and bottom of the stacked structure, making electrical characteristics unstable and causing voids to be formed in the film. If the trench or the hole part is blocked, this prevents the structure from functioning as a memory cell.

Therefore, it is desirable that a film to be formed in a trench or a hole should be thin. In contrast, when a cell is driven, it is preferable to make the film thick because current flowing in the cell needs to be decreased. In this case, however, it becomes difficult to reduce the distance between adjacent cells.

To miniaturize the cell structure vertically (or in a direction perpendicular to the substrate surface), it is necessary to make thinner each of the conductive film and element isolation insulating film. When the element isolation insulating film is made thinner, the distance between adjacent cells in a vertical direction decreases, forming a current path between adjacent cells, which might result in interference of adjacent cells. Therefore, to prevent interference of elements adjacent to each other vertically, it is necessary to form the original conductive paths in a cell so as to separate the conductive paths at regular intervals. If control is performed so as to form conductive paths at specific intervals, the smallest electrode pitch can be set.

Figure 5:
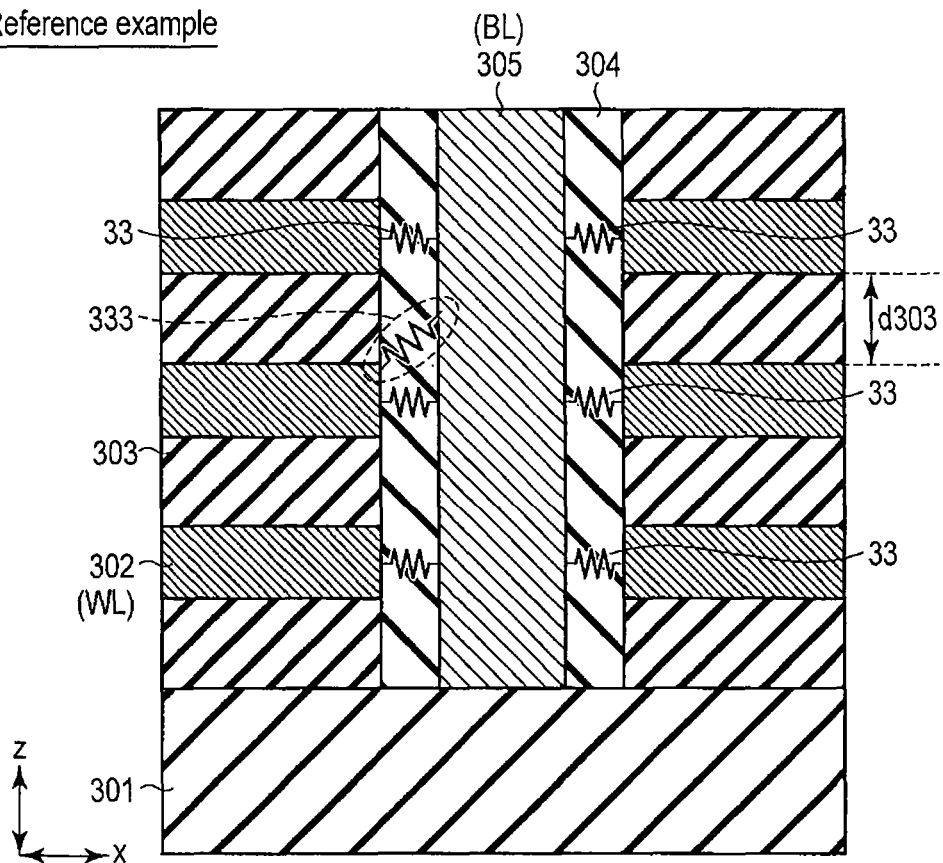
FIG. 5 is a sectional view of a memory cell array according to a reference example.

For example, FIG. 5 is a sectional view of a memory cell array according to a reference example. As shown in FIG. 5, the two-terminal resistance change element comprises a resistance change layer 304 sandwiched between a conductive layer 302 and a conductive layer 305 serving as an opposite electrode.

With this configuration, to reduce the element vertically (or in a z direction), it is necessary to make thinner the film thickness of each insulating layer 303 that electrically insulates each of a plurality of cells stacked one on top of another. In this case, since the conductive layer 305 is common to the cells, a plurality of conductive paths passing through the resistance change layer 304 are formed. For example, a conductive path (or a filament path) 333 encircled by a broken line in FIG. 5 is formed diagonally in the resistance change layer 304 and shared with a cell in a layer next above the present one. That is, when the resistance value of the cell is read, current flows through the conductive path 333, which influences the determination of the resistance value of the cell.

Therefore, the characteristics of the element tend to vary and become unstable. Accordingly, to stabilize the characteristics of the element, it is important that the conductive paths of all the elements are homogeneous.

As described above, with the miniaturization, a conductive path (or a filament path) 333 occurs randomly in the element of the reference example, which makes it necessary to give the element a latitude vertically (or in a z direction). Therefore, it is difficult to achieve further miniaturization.

Accordingly, in embodiments described below, a semiconductor memory device capable of forming a conductive path more stably and a method of manufacturing the same will be proposed. In an explanation below, although a semiconductor memory device and a method of manufacturing the same will be described, taking a ReRAM as an example, the ReRAM is only illustrative, not restrictive. In the explanation below, common parts will be indicated by common reference numerals throughout all the drawings.

First Embodiment

1. Configuration

The configuration of a semiconductor memory device according to a first embodiment will be explained.

1.1 Overall Configuration

As shown in FIG. 1, the semiconductor memory device of the first embodiment comprises a memory block 20, an address buffer 14-1, a command buffer 14-2, a fuse register 15, a power-on reset circuit 16, a control circuit 17, a voltage generator circuit 18, and an input/output buffer 19.

The memory block 20 comprises a memory cell array MA, a row decoder (Row Dec) 11, a column decoder (Col Dec) 12, and a sense amplifier (SA) 13.

The memory cell array MA includes a plurality of memory cells arranged in a matrix at the intersections of a plurality of bit lines and a plurality of word lines. A plurality of memory cell arrays MAs are stacked one on top of another in a direction of z perpendicular to the surface of the semiconductor substrate as described later, which forms a three-dimensional structure.

The row decoder 11 decodes a row address. The row decoder 11 includes a drive circuit that drives a word line (not shown).

The column decoder 12 decodes a column address. The column decoder 12 includes a drive circuit that drives a bit line (not shown).

The sense amplifier (SA) 13 reads data in a memory cell electrically connected to a bit line selected by the column decoder 12.

The address buffer 14-1, which is electrically connected to the row decoder 11 and column decoder 12, holds a row address and a column address.

The command buffer 14-2, which is electrically connected to the control circuit 17, holds a control command.

The fuse register 15, which is electrically connected to the input/output buffer 19 via a data bus or the like, holds necessary data, such as management data.

The power-on reset circuit 16 detects the power-on of the semiconductor memory device and outputs a reset signal to the control circuit 17.

The voltage generator circuit 18, which is electrically connected to the row decoder 11, column decoder 12, and sense amplifier 13, supplies necessary voltages to the above circuits under the control of the control circuit 17. The input/output buffer 19, which is electrically connected to the sense amplifier 13 and fuse register 15 via a data bus line, holds data, addresses, and commands for an external host device or the like.

The control circuit 17 controls the above circuits. For example, the control circuit 17 controls the above circuits and performs Set, Reset, Read, and Sensing operations, and the like which will be described later.

1-2. Configuration of a Memory Block

Next, FIG. 2 shows a three-dimensional configuration of the memory block 20 shown in FIG. 1.

As shown in FIG. 2, the memory block 20 of the first embodiment includes a plurality of layers (four layers, in this example) of memory cell arrays MA0 to MA3. This memory block 20 is stacked on a peripheral region 23 in which interconnections, including a global bus, and transistors are formed and on a word-line contact region 25.

On a semiconductor substrate 100, the peripheral region 23 is provided. In the peripheral region 23, the global bus and others for exchanging data to be written into/read from the memory block 20 with the outside are provided. In the peripheral region 23, the column decoder 12, sense amplifier 13, row decoder 11, and others may be arranged.

To connect the word lines WLs and bit lines BLs of the memory cell arrays MA0 to MA3 stacked one on top of another with the peripheral region 23 formed on the semiconductor substrate 100, vertical interconnections (via contacts) are needed on the side of the memory block 20. Therefore, word-line contact regions 25 are provided to two sides of the peripheral region 23. In the word-line contact regions 25, word-line contacts 27 for connecting word lines WLs with the control circuit and others are formed.

Each word line WL is arranged along the surface of the semiconductor substrate 100 (in an x direction, in this case). One end of the word line WL is connected to the peripheral region 23 via a word-line contact 27 formed in the word-line contact region 25.

Each bit line BL is arranged in a direction perpendicular to the surface of the semiconductor substrate 100 (in a z direction, in this case) so as to intersects a word line WL and be common to memory cell arrays MA0 to MA3. One end of the bit line BL is connected to the peripheral region 23. At the intersection of the word line WL and the bit line WL, a memory cell MC is arranged.

FIG. 2 shows a memory block 20 where a plurality of memory cell arrays MA0 to MA3 are stacked one on top of another in a direction perpendicular to the semiconductor substrate 100 (in the z direction). A plurality of such unit memory blocks 20 may be arranged in a matrix in a longitudinal direction of word line WL and in a longitudinal direction of bit line BL (in the z direction).

The word-line contact regions 25 are not limited to the configuration shown in this example.

1-3. Configuration of Memory Cell Array (MA)

FIG. 3 shows an example of memory cell array MA0 shown in FIG. 2. The other memory cell arrays MA1 to MA3 have the same configuration as that of MA0.

As shown in FIG. 3, in memory cell array MA0, a plurality of memory cells MC are arranged at the intersections of word lines WLs and bit lines BLs.

Each memory cell MC is composed of a variable resistive element 33 that stores an electrically rewritable resistance value as data in a nonvolatile manner.

One end of the current path of the variable resistive element 33 is connected to any one of the word lines WLs. The other end of the current path is connected to any one of the bit lines BLs. The variable resistive element 33 is made of, for example, metal oxide, specifically metal oxide including tantalum, niobium, tungsten, nickel, titanium, zirconium, hafnium, or transition metal, or an alloy of silicon or aluminum. The configuration of the memory cell MC is not limited to what has been described in this example.

1-4. Set, Reset, and Read Operations

Next, a Set, a Reset, and a Read operation of the first embodiment will be explained briefly with reference to FIG. 4.

(Set Operation)

A set operation is the operation of writing data in a memory cell. To write data into a memory cell, a voltage is applied to the variable resistive element 33 acting as the selected memory cell, generating a potential gradient in the variable resistive element 33, which causes current to flow. For example, the potential of a word line WL is made relatively lower than the potential of a bit line BL. Specifically, as shown in FIG. 4, a write voltage ($V_{set}$) is applied to a bit line BL and a ground potential is applied to a word line WL. This Set operation forms a conductive path between the bit line BL and word line WL, and thereby the resistance value of the variable resistive element 33 is decreased.

Figure 4:
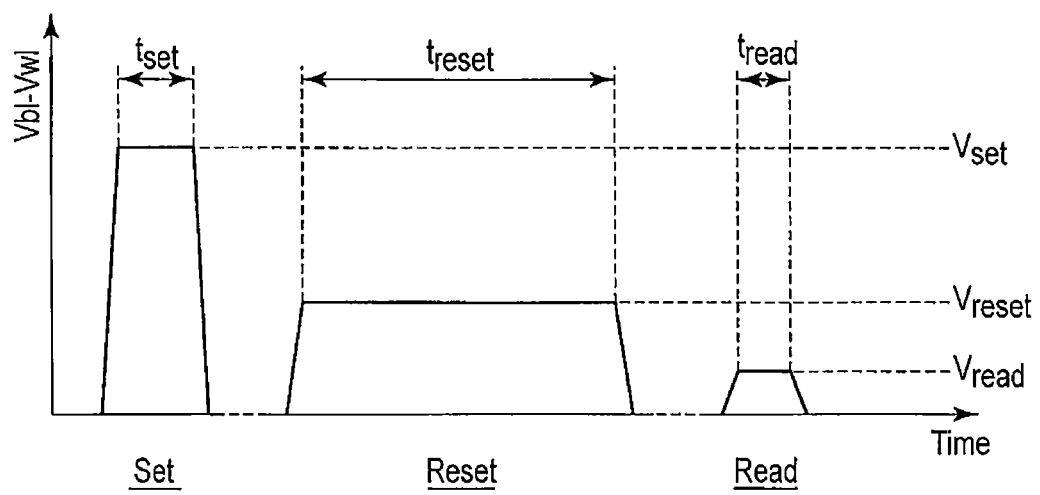
FIG. 4 is a diagram to explain Set, Reset, and Read in the semiconductor memory device of the first embodiment.

A vertical axis in FIG. 4 indicates a potential difference between voltage Vb1 of the bit line and voltage Vw1 of the word line.

(Reset Operation)

A Reset operation is the operation of erasing data in a memory cell. The Reset operation is performed by subjecting the selected variable resistive element 33 to Joule heating by current pulses, stimulating an oxidation-reduction reaction of the variable resistive element 33.

For example, as shown in FIG. 4, an erase voltage ($V_{reset}$) is applied between the word line WL and bit line BL during time $t_{reset}$. The erase voltage ($V_{reset}$) is lower than the write voltage ($V_{set}$) and time $t_{reset}$ is longer than time $t_{set}$ of a Set operation. The Reset operation causes the resistance value of the variable resistive element 33 to return to a high value, thereby causing the conductive path between the bit line BL and word line WL to disappear.

(Read Operation)

A Read operation is the operation of reading data from a memory cell. A read operation is such that, for example, a voltage pulse is applied to the selected variable resistive element 33 and the sense amplifier 13 senses a current determined by the resistance value of the memory cell. It is desirable that the voltage pulse of the Read operation should have such a small amplitude that the resistance value of a material constituting the variable resistive element 33 does not change. Specifically, as shown in FIG. 4, voltage $V_{read}$ of a voltage pulse in a Read operation is set lower than the erase voltage ($V_{reset}$) and time $t_{read}$ of a reset operation is set shorter than time $t_{set}$ of a Set operation. Read voltage $V_{read}$ is applied to the selected memory cell from a bit line BL. The sense amplifier 13 measures a current value at that time, thereby reading data from the memory cell.

As described above, the relationship between the operation times is expressed as time $t_{read}$<time $t_{set}$<time $t_{reset}$. The relationship between the voltages in the operations is expressed as write voltage $V_{set}$>erase voltage $V_{reset}$>read voltage $V_{read}$. However, these are just illustrative and the above relationships can be changed suitably as needed, depending on the material of the variable resistive element 33.

1-5. Planar and Sectional Configurations of Reference Example

In FIG. 5, a sectional configuration of the memory cell array MA of the reference example will be explained. As shown in FIG. 5, a sectional structure of the memory cell array of the reference example is such that a conductive layer 302 and an insulating layer 303 are stacked vertically (in a z direction). The sectional structure includes a resistance change layer 304 sandwiched between each conductive layer 302 and a conductive layer 305 acting as an opposite electrode.

In this way, since the conductive layer 305 is common to a plurality of memory cells stacked one on top of another, a plurality of conductive paths passing through the resistance change layer 304 are formed as described above. For example, a conductive path 333 encircled by a broken line in FIG. 5 is formed diagonally and shared with a cell in a layer next above the present one.

1-6. Planar and Sectional Configurations

Figure 6:
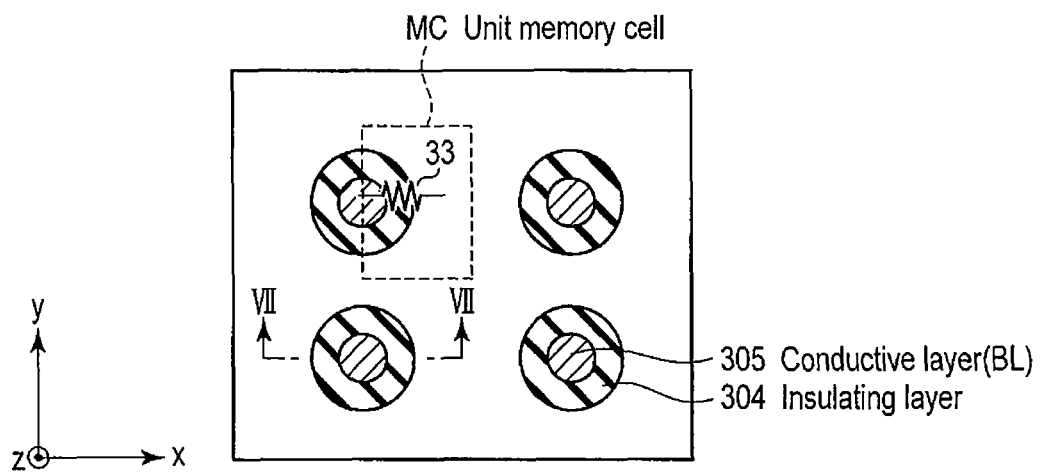
FIG. 6 is a plan view of the memory cell array according to the first embodiment.
Figure 7:
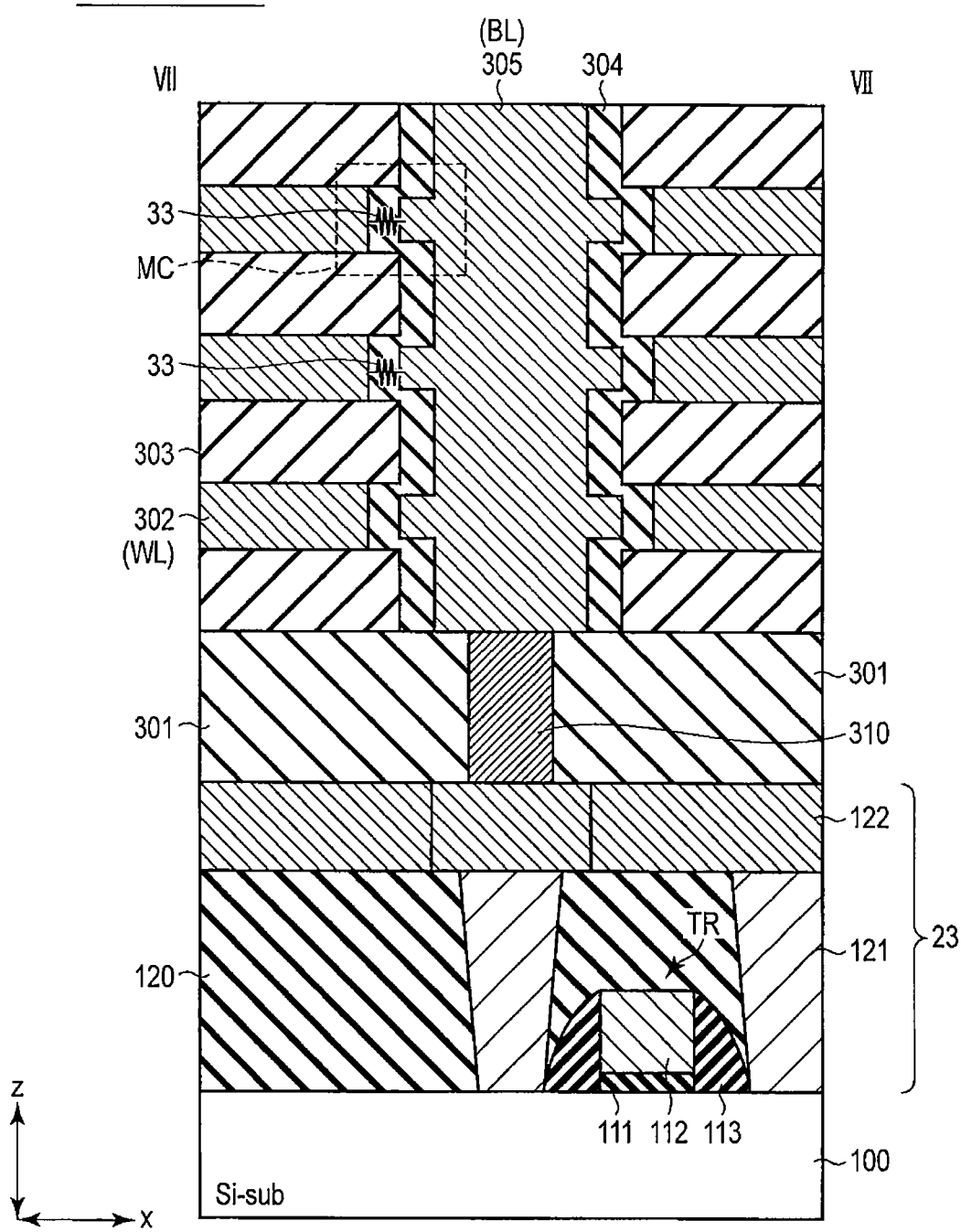
FIG. 7 is a sectional view taken along line VII-VII of FIG. 6.

FIGS. 6 and 7 show a planar structure and a sectional structure of the memory cell array MA of the first embodiment, respectively. FIG. 7 shows a sectional structure taken along line VII-VII of FIG. 6.

As shown in FIGS. 6 and 7, a region in which a two-terminal element is to be formed is columnar. In the region, a plurality of unit memory cells MCs isolated by resistance change layers 304 are arranged. For example, in a unit memory cell MC encircled by a broken line in FIG. 6, a region where a two-terminal element is to be formed is columnar. As shown in FIG. 7, each memory cell MC is composed of a resistance change layer 304 sandwiched between an opposite electrode 305 acting as a bit line (BL) and a conductive layer 302 acting as a word line (WL). The resistance change layer 304 formed by current flowing in the opposite electrode 305 (BL) and conductive layer 302 (WL) makes a variable resistive element 33 of the memory cell MC.

As shown in FIG. 7, a plurality of memory cells are formed by stacking a plurality of conductive layers 302 (WLs) and a plurality of insulating films 303 one on top of another on an interlayer insulating film 301 formed above the semiconductor substrate (Si-sub) 100. The opposite electrode 305 and resistance change layer 304 are arranged so as to pass through the stacked conductive layers 302 (WLs) and insulating layers 303 and reach the interlayer insulating film 301. For example, a unit memory cell MC encircled by a broken line in FIG. 7 is composed of a resistance change layer 304 sandwiched between the opposite electrode 305 (BL) and conductive layer 302 (WL).

The opposite electrode 305 (BL) is connected electrically to the peripheral region 23 via a contact plug 310 provided in the interlayer insulating film 301.

In the peripheral region 23, interconnection layers 121, 122 arranged in the interlayer insulating film 120, a transistor TR, and others are arranged. The interconnection layers 121, 122 electrically connect the contact plug 310 to the current path of the transistor TR. The transistor TR comprises a gate insulating film 111 provided on the semiconductor substrate 100, a gate electrode 112 provided on the gate insulating film, and a spacer 113 arranged along the sidewall of the gate electrode 112.

As described above, the conductive layer 302 in the semiconductor memory device of the first embodiment is located medial to the insulating film 303 with respect to the cell end in the x direction.

With the above configuration, since the conductive layer 302 of the first embodiment is recessed with respect to the insulating layer 303, the conductive path formation region is limited. That is, the face of the conductive layer 302 on the opposite electrode 305 side is retreated from the face of the insulating layer 303 on the opposite electrode 305 side by, for example, almost the film thickness of the resistance change layer 304. Therefore, the conductive layer 302 and two insulating layers 303 arranged on the top face and bottom face of the conductive layer 303 form a concave part. The resistance change layer 304 is formed on the face of the insulating layer 303 on the opposite electrode 305 side and in the concave part, with the result that the film thickness of the resistance change layer 304 located between the resistance change layer 304 in the concave part and the resistance change layer 304 in contact with the face of the insulating layer 303 on the opposite electrode 305 side is thinner than the film thickness of the remaining parts.

The opposite electrode 305 is formed so as to be in contact with the resistance change layer 304 touching the side of the insulating layer 303 and with the resistance change layer 304 formed in the concave part. Therefore, the opposite electrode 305 includes a convex part corresponding to the concave part.

With the configuration of the first embodiment, the distance from the face of the conductive layer 302 on the opposite electrode 305 side to the opposite electrode 305 corresponding to the side of the insulating layer 303 is longer than the reference example shown in FIG. 5. Therefore, a diagonal conductive path as shown in the reference example can be prevented from being formed. Accordingly, even if the insulating layer 303 is made thinner, mutual interference of memory cells adjacent to each other vertically is less and therefore cells can be made miniaturized.

2. Manufacturing Method

Next, a method of manufacturing a semiconductor memory device of the first embodiment will be explained.

Although not shown, a peripheral circuit 23 including the peripheral region for driving a memory cell array MA is formed on the semiconductor substrate 100.

Figure 8:
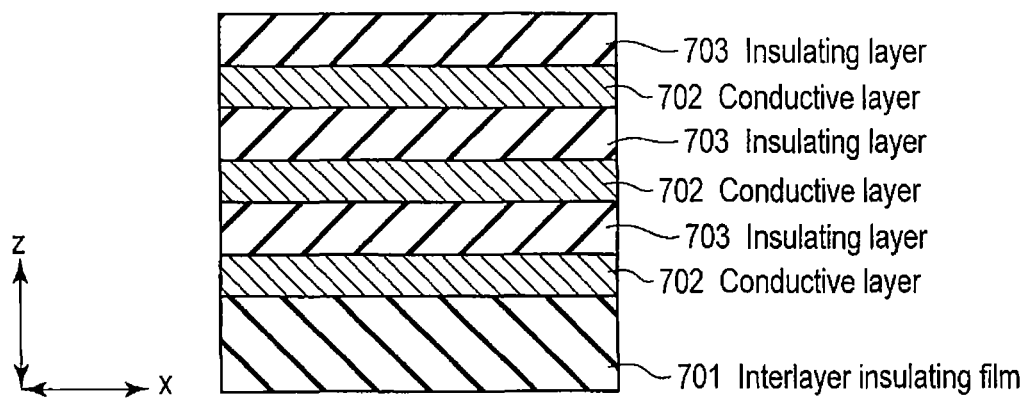
FIG. 8 is a diagram to explain a step of manufacturing a semiconductor memory device according to the first embodiment.

Then, as shown in FIG. 8, an interlayer insulating film 701 is formed on the substrate (not shown) 100 on which the peripheral circuit 23 for driving the memory cell array MA has been formed. Then, a stacked structure of a conductive layer 702 and an insulating layer 703 is formed using, for example, a CVD method. The stacked structure is composed of a repetition of two or more layers of conductive layers and insulating layers. For the sake of simplicity, FIG. 8 shows a case where three layers of conductive layers are stacked. The film thickness of the conductive layer 702 is set to, for example, about 10 nm and the film thickness of the insulating layer 703 is set to about 20 nm.

To keep leak current between an upper and a lower interconnection low and prevent interference of memory cells adjacent to each other vertically, it is desirable that the film thickness of the insulating layer 703 should be, for example, about 5 nm or more. The interlayer insulating film 701 is, for example, a silicon oxide film. The conductive layer 702 is made of metal, such as W, TiN, or WN, metal nitride, or conductive silicon (e.g., doped silicon).

Figure 9:
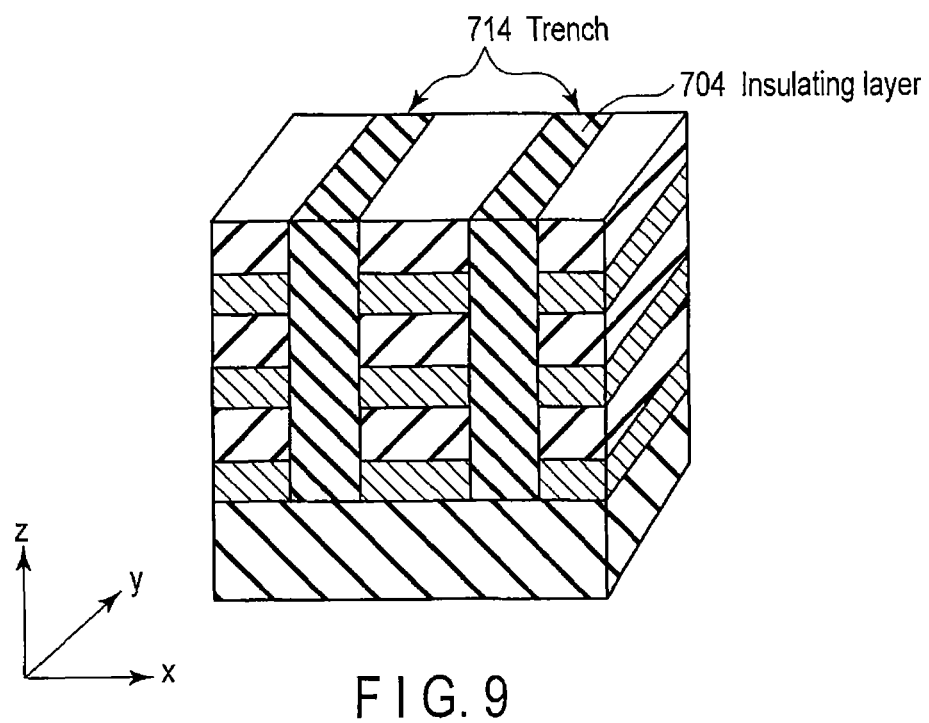
FIG. 9 is a diagram to explain a step of manufacturing the semiconductor memory device according to the first embodiment.

Next, as shown in FIG. 9, the insulating layer 703 and conductive layer 702 are etched to the surface of the interlayer insulating film 701 using, for example, lithographic techniques and dry etching techniques, thereby forming trenches 714.

An insulating film 704 is formed all over the surface including the formed trenches 714. The insulating film 704, which is, for example, a silicon oxide film, is formed by a CVD method or a coating method. Thereafter, the insulating film 704 is planarized using CMP techniques or the like, thereby filling the trenches 714 with the interlayer insulating film 704.

Next, as shown in FIG. 10, holes 720 are made in the interlayer insulating film on the trenches 714 and the parts of the adjacent insulating layers 703 at intervals using lithographic techniques and dry etching techniques. The holes 720 are made by etching so as to reach the top of the interlayer insulating film 701. On the cross section of each hole, a conductive layer and an interlayer insulating film are exposed alternately.

FIG. 11A is a sectional view of a hole 720 part (cell part) taken along line B1-B1' of FIG. 10. FIG. 11B is a sectional view of a non-hole part taken along line C1-C1' of FIG. 10. As shown in FIG. 11A, in the cell part, a conductive layer 702 and an insulating layer 703 are exposed alternately in the hole 720.

Figure 12:
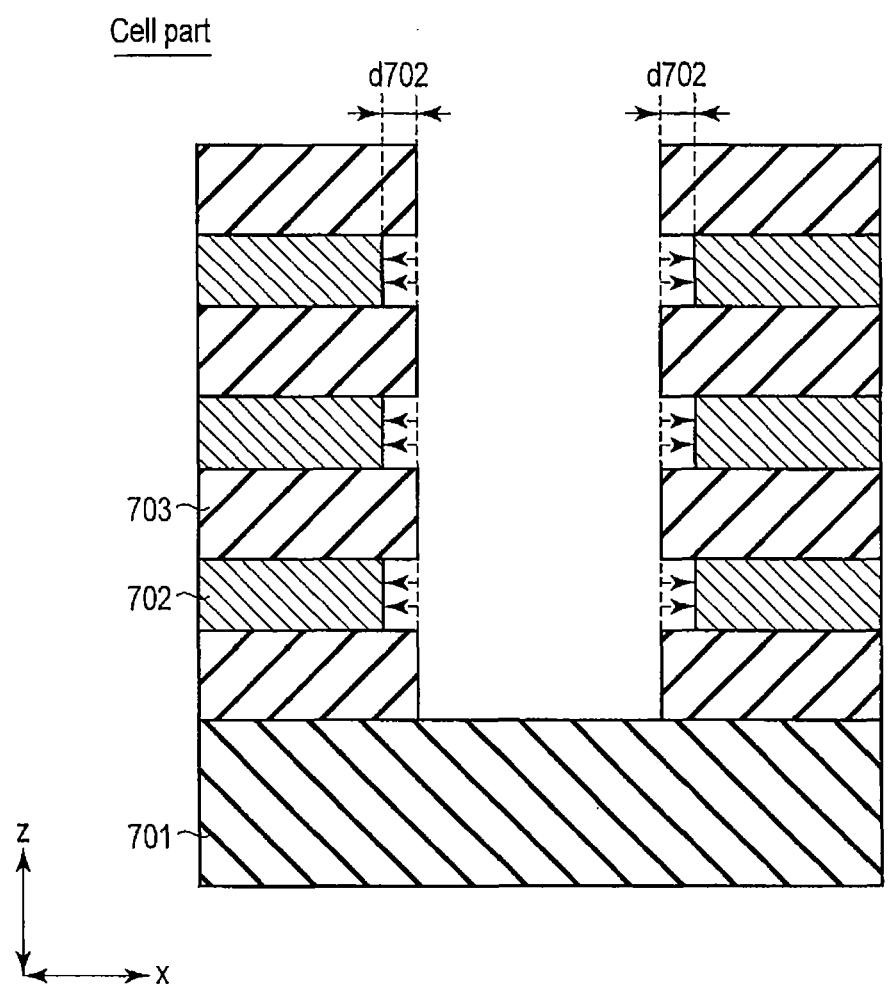
FIG. 12 is a diagram to explain a step of manufacturing the semiconductor memory device according to the first embodiment.

Next, as shown in FIG. 12, the side of the conductive layer 702 exposed in the hole 720 of the cell part is retreated in the x direction with respect to the side of the insulating layer 703.

When the conductive layer 702 is a metallic material in this process, wet etching is done with a mixed solution of hydrogen peroxide and water, enabling the conductive layer 702 to be retreated inward with respect to the insulating layer 703 composed of a silicon oxide film.

The etching method is not limited to this. A method of using a wet solution for etching a metal or a method of performing chemical etching in a vapor-phase atmosphere, such as chlorine-base gas, can be used.

When the conductive layer 702 is a doped silicon film, wet etching is done with a mixed solution of nitric-acid-series chemical solution and water, enabling the conductive layer 702 to be retreated inward with respect to the insulating layer 703 composed of a silicon oxide film.

It is more desirable that a width d702 by which the conductive layer 702 is retreated should be greater than the film thickness d704 of a resistance change layer 704, such as a metal oxide film, to be formed in the next step (d702>d704). This is because it goes without saying that, even if the conductive layer 702 is thinner than the resistance change layer 704, it give effects and because, when the retreat width d702 is greater than the film thickness d704 of the resistance change layer 704, the conductive layer 702 can be isolated from an opposite electrode 705 described later more reliably from the physical standpoint.

Figure 13:
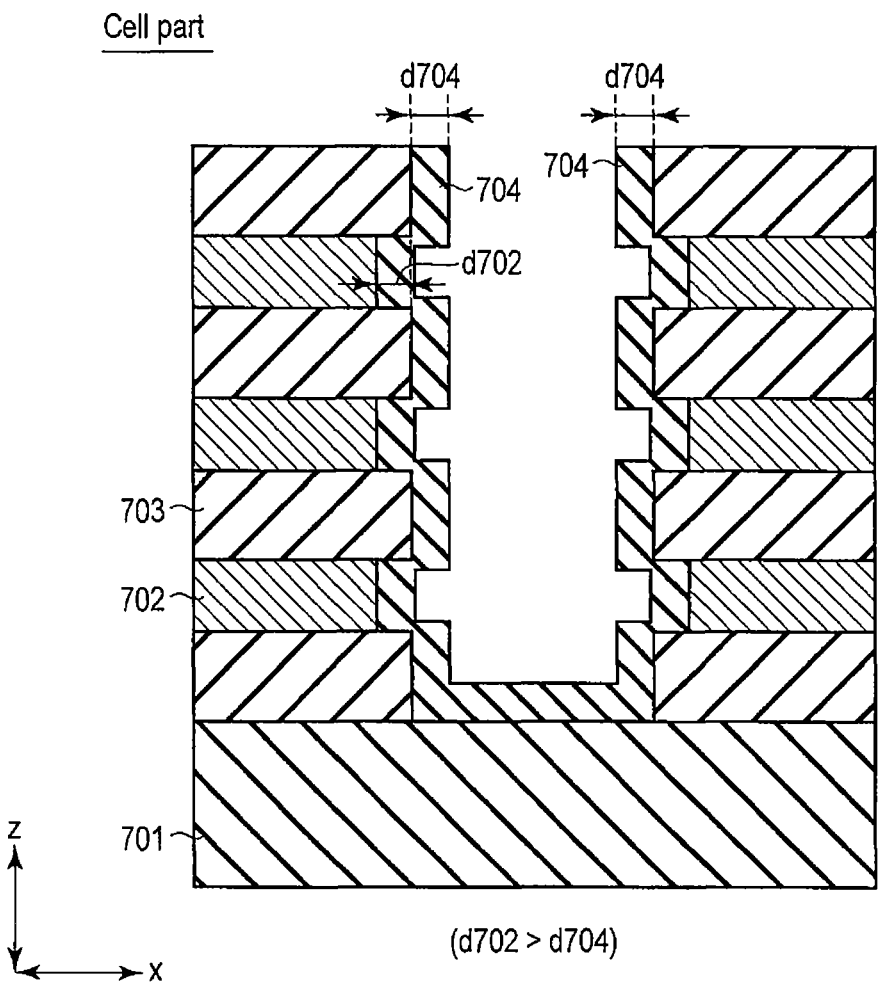
FIG. 13 is a diagram to explain a step of manufacturing the semiconductor memory device according to the first embodiment.

Then, as shown in FIG. 13, a metal oxide layer making a resistance change layer 704 is formed using a CVD method. To make the resistance change layer 704 smoother, it is preferable to use an Atomic Layer Deposition (ALD) method. Since a film is formed while material gases are being supplied alternately in the ALD method, the resistance change layer is easily influenced by the surface state. The metal film surface is particularly active and therefore molecules are liable to break down, making the film forming speed faster. In contrast, since the interlayer insulating film is an inactive silicon oxide film, it has the property of being slow in film forming speed. Setting deposition conditions under which the property develops enables a resistive film to be selectively deposited only on the side of the metal conductive layer 702 making a WL interconnection, enabling a space in the hole to be secured.

For example, when the metal oxide is a hafnium oxide, tetrakis (ethyl methyl amino) hafnium is used as hafnium material and ozone, $H_2O$, or the like is used as an oxidizer. The substrate is placed in a processing chamber in a reduced-pressure atmosphere (of, for example, about 20 Pa) and heated to about 400° C. In this situation, tetrakis (ethyl methyl amino) hafnium is supplied for a short time, causing molecules to be adsorbed onto the conductive layer 702. The extra material not adsorbed is discharged by a nitrogen purge. Then, $H_2O$ is supplied as an oxidizer and caused to react with the hafnium material, thereby forming a hafnium oxide film. The extra $H_2O$ not reacted is discharged by a subsequent nitrogen purge. Since the film thickness per cycle is determined by the amount of hafnium material adsorbed, the above process is repeated until a desired film thickness has been reached. By changing a heating temperature of the wafer, specifically, by lowering the temperature until the hafnium material can be adsorbed only onto the conductive metal, a film can be selectively formed only on the conductive layer 702 without being deposited on the interlayer insulating film 703.

In this way, after a resistance change layer 704 has been formed on the side of the conductive layer 702 earlier than the interlayer insulating film 703, a resistance change layer 704 is formed on the side of the interlayer insulating film 703.

Figure 14:
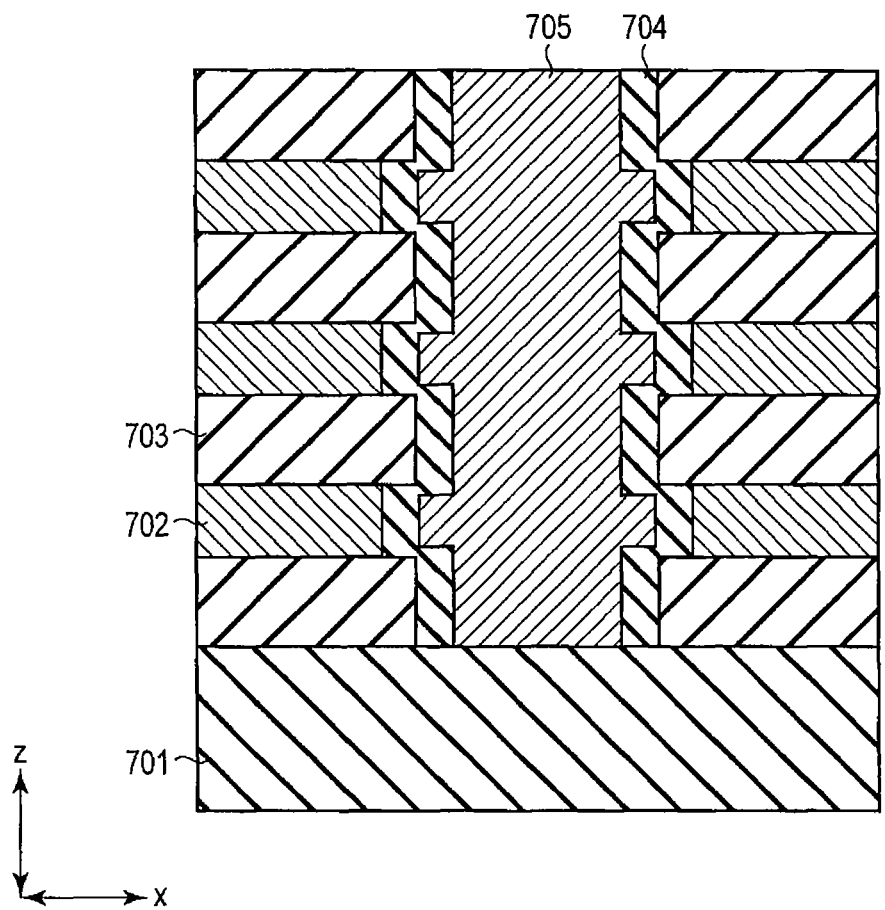
FIG. 14 is a diagram to explain a step of manufacturing the semiconductor memory device according to the first embodiment.

Next, as shown in FIG. 14, the resistance change layer 704 at the bottom of the hole is removed by anisotropic etching. Then, using a CVD method, a conductive layer 705 is formed in the hole, thereby forming an opposite electrode 705 to the conductive layer 702.

The resistance change layer 704 at the bottom of the hole is removed to electrically connect a contact hole partially made in the interlayer insulating film 701 to the opposite electrode 705.

By the above manufacturing steps, the conductive layer 702 and conductive layer 705 are arranged so as to sandwich the resistance change layer 704 between them, thereby forming a memory cell array of two-terminal resistance change elements.

3. Operational Advantage

A semiconductor memory device of the first embodiment and a method of manufacturing the same produce at least the following effect in item (1) described below.

(1) It is possible to provide a semiconductor memory device capable of forming a conductive path more stably and a method of manufacturing the same.

As described above, the conductive layer 302 in the semiconductor memory device of the first embodiment in FIG. 7 is arranged medial to the insulating layer 303 with respect to the cell end in the x direction. Therefore, the conductive layer 302 is recessed with respect to the insulating layer 303 and therefore a conductive path formation region is limited within the recessed part. Accordingly, even if the insulating layer 303 is formed into a thin film, mutual interference of cells adjacent to each other vertically is less, making the conductive path of the memory cell more stable. In other words, the conductive path can be formed homogeneously in all the memory cells. Therefore, stable element characteristics can be obtained.

In the case of the reference example shown in FIG. 5, a plurality of conductive paths have been formed in the resistance change layer 304 sandwiched between the conductive layer 302 and conductive layer 305 and conductive paths have interfered with one another between different memory cells. Therefore, the configuration of the reference example is disadvantageous to miniaturization. In addition, the configuration of the reference example tends to permit the element characteristics to vary and operations to become unstable.

Second Embodiment

Next, a semiconductor memory device according to a second embodiment and a method of manufacturing the same will be explained. In the explanation below, a detailed explanation of what overlaps with the first embodiment will be omitted.

<Configuration>

As shown in FIG. 15, an interlayer insulating film 301 is formed on a substrate (not shown) on which a peripheral circuit 23 that drives a memory cell array has been formed. On the interlayer insulating film 301, a plurality of conductive layers 302 and a plurality of insulating layers 303 are stacked repeatedly.

Furthermore, in the second embodiment, the side of the conductive layer 302 in a hole is arranged so as to be retreated more in an x direction than the side of the insulating layer 303, with the side of the insulating layer 303 being inclined upward in the hole (in a z direction). In other words, the side of the insulating layer 303 is inclined so as to have a convex shape facing toward the bottom of the hole.

As described above, forming the insulating layer 303 into a convex shape facing downward enables the conductive path formation region of a resistive layer 304 to be limited in a part perpendicular to the side of the conductive layer 302. Therefore, mutual interference of cells adjacent to each other vertically can be reduced and therefore memory cells can be miniaturized.

<Manufacturing Method>

In a method of manufacturing a semiconductor memory device according to the second embodiment, first, a stacked structure of a conductive layer 702 and an insulating layer 703 is formed using the same manufacturing steps as in the first embodiment.

Next, holes are made in the stacked structure using the same manufacturing step as in the first embodiment. Then, the conductive layer 702 is retreated medial to the insulating layer 703 in an x direction with respect to the cell end using the same manufacturing steps described above.

Figure 16:
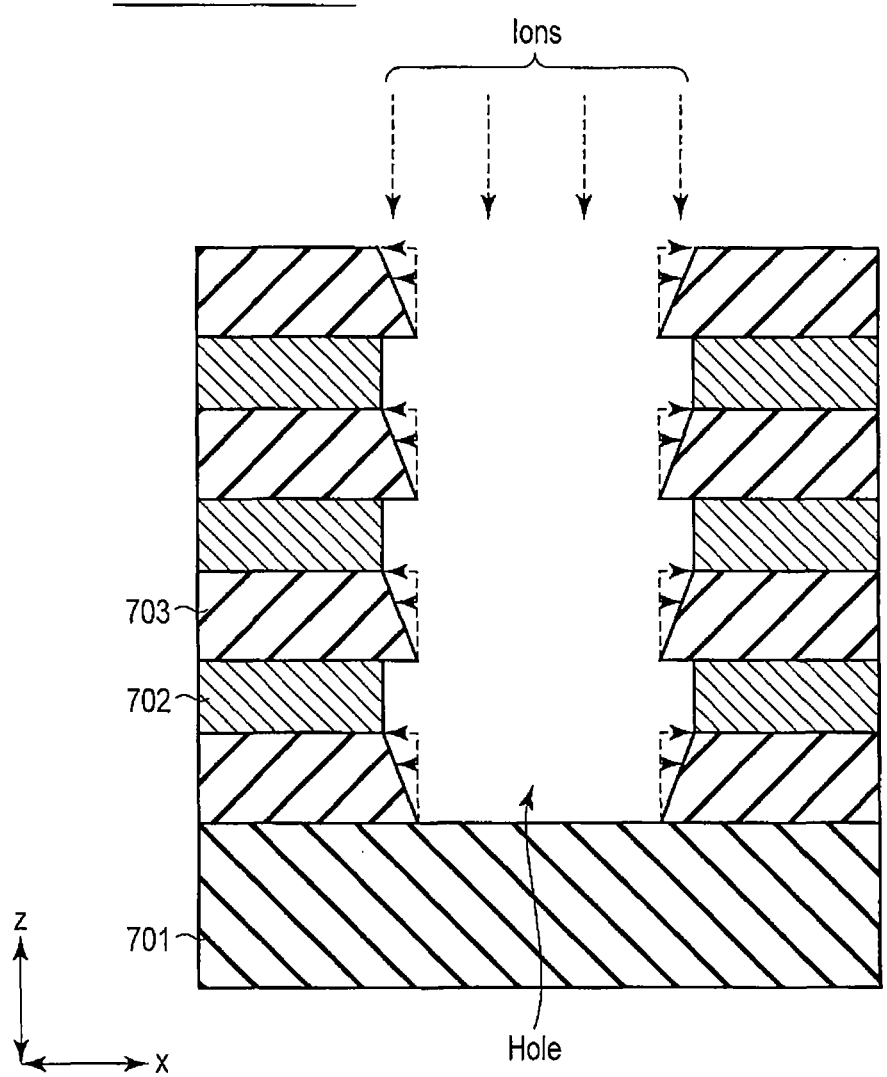
FIG. 16 is a diagram to explain a step of manufacturing a semiconductor memory device according to the second embodiment.

Next, as shown in FIG. 16, the end of the insulating layer 703 exposed in the hole is irradiated with argon ions or the like to perform ion-beam etching, thereby etching the end of the insulating layer 703 to form a vertically asymmetric structure whose side looks upward in the hole and whose lower part projects more than its upper part. Although the top end of the insulating layer 703 has been etched in FIG. 16, the end of the insulating layer 703 may be irradiated with ions in place of argon ions and the etching shape of the end of the insulating layer 703 may be controlled into an inverse tapered shape.

The remaining manufacturing steps are virtually the same as in the first embodiment and therefore a detailed explanation of them will be omitted.

<Operational Advantages>

The semiconductor memory device of the second embodiment and the method of manufacturing the same produce at least the same effect as that of item (1).

In addition, according to the second embodiment, the conductive layer 302 is arranged medial to the insulating layer 303 in the x direction with respect to the cell end and the insulating layer 303 has a convex shape facing downward in the z direction.

As described above, the insulating layer 303 is configured to have a convex shape facing downward, enabling the conductive path formation region of the resistive layer 304 to be limited further. Therefore, the second embodiment has the greater advantage that mutual interference of cells adjacent to each other vertically can be reduced and memory cells can be miniaturized.

Third Embodiment

Next, a semiconductor memory device according to a third embodiment and a method of manufacturing the same will be explained. In the explanation below, a detailed explanation of what overlaps with the first embodiment will be omitted.

<Configuration>

Figure 17:
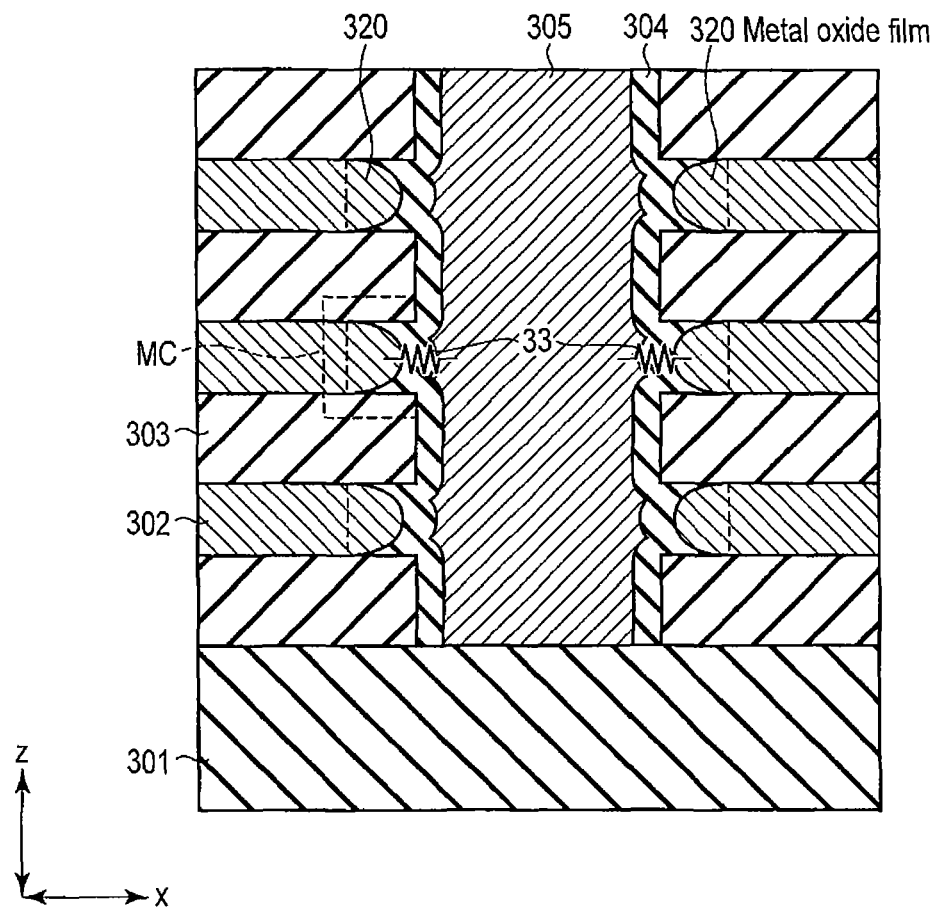
FIG. 17 is a sectional view of a memory cell array according to a third embodiment.

As shown in FIG. 17, an interlayer insulating film 301 is formed on a substrate (not shown) on which a peripheral circuit 23 that drives a memory cell array has been formed. On the interlayer insulating 301, a plurality of conductive layers 302 and a plurality of insulating layers 303 are stacked repeatedly. The conductive layer 302 is arranged so as to be retreated medial to the insulating layer 303 with respect to the cell end and the side of the conductive layer 302 is configured to have a convex shape. Specifically, the side of the conductive layer 302 is formed into almost a hemisphere shape.

Because the side of the conductive layer 302 has a convex shape as described above, a conductive path can be concentrated at the convex part of the conductive layer 302.

Therefore, the conductive path formation region can be limited further, enabling mutual interference of cells adjacent to each other vertically to be reduced and memory cells to be miniaturized.

<Manufacturing Method>

In a method of manufacturing a semiconductor memory device according to the third embodiment, first, a stacked structure of a conductive layer 702 and an insulating layer 703 is formed as in the first embodiment. Next, a hole is made in the stacked structure. Then, the conductive layer 702 exposed in the hole is retreated in an x direction with respect to the insulating layer 703.

Figure 18:
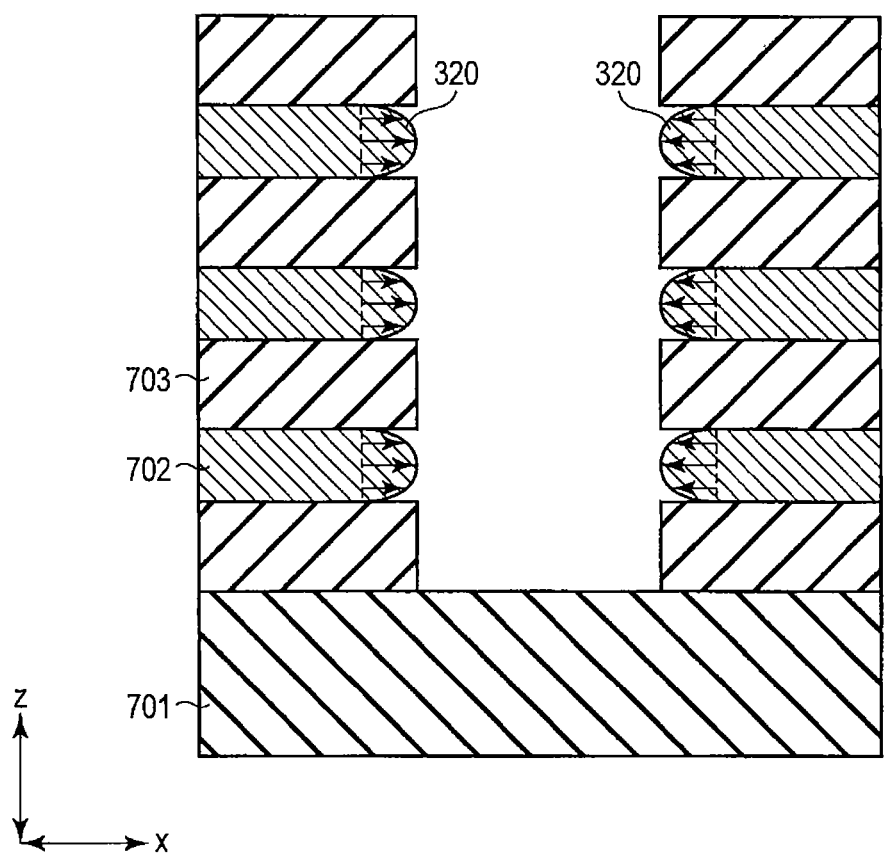
FIG. 18 is a diagram to explain a step of manufacturing a semiconductor memory device according to the third embodiment.

Next, as shown in FIG. 18, the side of the conductive layer 702 is heat treated in an oxidation atmosphere by, for example, a thermal oxidation method. This causes a metal oxide layer to grow on the side of the conductive layer 702. Specifically, the metal oxide layer grows from the side of the conductive layer 702 toward the inside of the hole (in the x direction), forming a convex shape 320.

In this step, a part of the conductive layer 702 is oxidized to a resistance change layer 704, enabling the resistance change layer 704 to be formed only in a region in contact with the conductive layer 702. Since oxidizing species are supplied, centering on a metallic conductive layer with a greater solid angle, oxidation progresses easily.

As a result, the convex shape 320 composed of a metal oxide formed on the side of the conductive layer 702 causes a conductive path to be formed easily near the center of the convex shape 320. In addition, since a metal oxide layer 320 makes a resistance change layer 304, a metal oxide layer 320 can be formed by a CVD method or an ALD method to adjust electrical characteristics.

For example, when the conductive layer 702 is a silicon film, a pure metal, such as nickel or titanium, is formed by a CVD method and then heat treated, causing the doped silicon film to react with the single metal to form metallic silicide, which enables a convex shape 320 made of metallic silicide to be formed on the side of the conductive layer 702. The formation of metallic silicide involves cubical expansion. Metal is supplied more in a part closer to the center of the conductive layer 702, making the reaction progress further and decreasing the effects of stress, which permits the volume to expand easily. As a result, the metallic silicide film takes a convex shape and a conductive path is formed near the center of the convex shape, depending on the shape of the metallic silicide film.

The metallic silicide film may be oxidized further to form a resistance change layer 704. Alternatively, a film of a resistance change layer 704 is further formed so as to be in contact with the metallic silicide film. It goes without saying that both shape control of the insulating layer 703 and shape control of the conductive layer 702 may be performed.

The remaining manufacturing steps are basically the same as in the first embodiment and therefore a detailed explanation of them will be omitted.

<Operational Advantages>

The semiconductor memory device of the third embodiment and the method of manufacturing the same produce at least the same effect as that of item (1).

In addition, the conductive layer 302 of the third embodiment is arranged medial to the insulating layer 303 with respect to the cell end and its side is configured to have a convex shape 320. Forming the side of the conductive layer 302 into a convex shape 320 enables a conductive path to concentrate in the central part of the convex shape 320, enabling the conductive path formation region to be limited further. Therefore, mutual interference of cells adjacent to each other vertically can be reduced, enabling cells to be miniaturized.

Fourth Embodiment

Next, a semiconductor memory device according to a fourth embodiment and a method of manufacturing the same will be explained. In the explanation below, a detailed explanation of what overlaps with the first embodiment will be omitted.

<Configuration>

Figure 19:
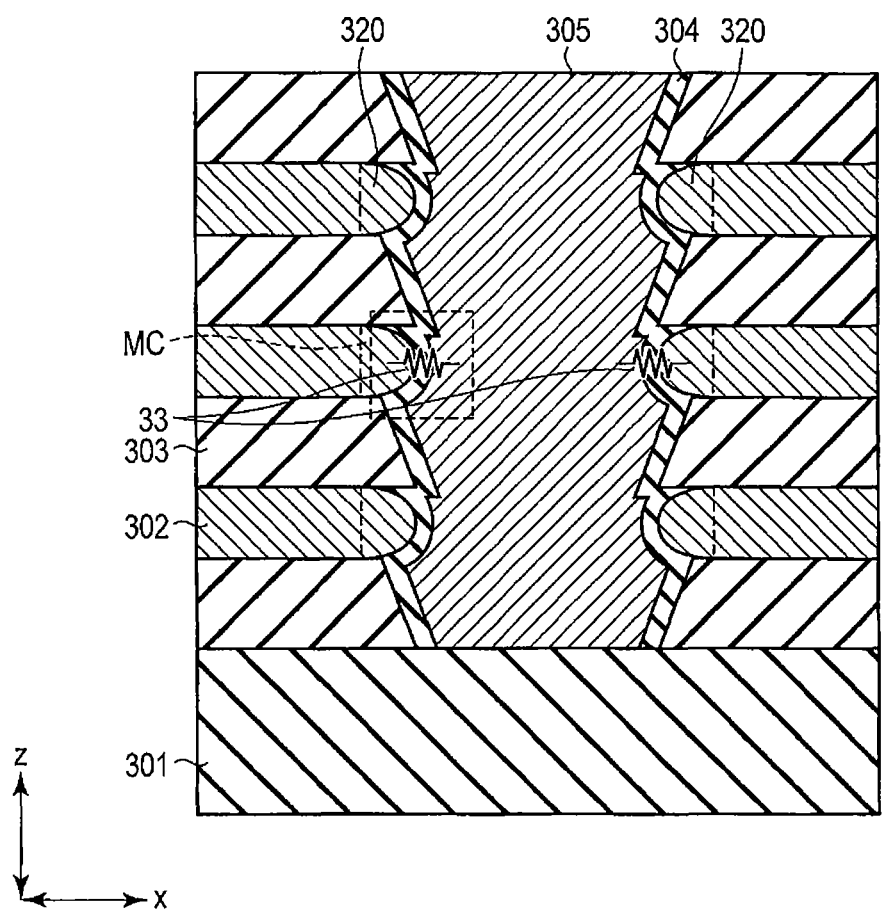
FIG. 19 is a sectional view of a memory cell array according to a fourth embodiment.

As shown in FIG. 19, in the semiconductor memory device of the fourth embodiment, an interlayer insulating film 301 is formed on a substrate (not shown) on which a peripheral circuit 23 that drives a memory cell array has been formed. On the interlayer insulating 301, a plurality of conductive layers 302 and a plurality of insulating layers 303 are stacked repeatedly, thereby forming a stacked structure. In the stacked structure, a hole is made. The side of each conductive layer 302 in the hole is arranged medial to the side of the insulating layer 303 with respect to the cell end. The side of the conductive layer 302 has a convex shape 320 as in the third embodiment. In addition, the side of the insulating layer 303 is inclined upward in the hole (in a z direction) and configured to have a convex shape facing toward the bottom of the hole.

<Manufacturing Method>

The manufacturing method is basically the same as in each of the above embodiments and therefore a detail explanation will be omitted.

<Operational Advantages>

The semiconductor memory device of the fourth embodiment and the method of manufacturing the same produce at least the same effect as that of item (1).

In addition, with the fourth embodiment, a plurality of conductive layers 302 and a plurality of insulating layers 303 are stacked repeatedly. The conductive layer 302 is arranged so as to be retreated medial to the insulating layer 303 with respect to the cell end. The side of the conductive layer 302 has a convex shape 320 and the side of the insulating layer 303 has a convex shape facing downward in a z direction. Therefore, the conductive path formation region can be limited further, enabling mutual interference of cells adjacent to each other vertically to be reduced. Accordingly, cells can be miniaturized.

Fifth Embodiment

Next, a semiconductor memory device according to a fifth embodiment and a method of manufacturing the same will be explained. In the explanation below, a detailed explanation of what overlaps with the first embodiment will be omitted.

<Configuration>

As shown in FIG. 20, in the semiconductor memory device of the fifth embodiment, an interlayer insulating film 301 is formed on a substrate (not shown) on which a peripheral circuit 23 that drives a memory cell array has been formed. A conductive layer 302 and a resistance change layer 304 are arranged so as to be retreated medial to an insulating layer 303 in an x direction with respect to the cell end. The resistance change layer 304 is formed only on the side of a conductive layer 302 in a concave part configured by two insulating layers 303 adjacent to each other vertically and the side of the conductive layer 302. In other words, the resistance change layer 304 is arranged only in the concave part medial to the insulating layer 303 in the x direction with respect to the cell end. An opposite electrode 305 is brought into direct contact with the side of the insulating layer 303 and with the resistance change layer 304 in the concave part. That is, the opposite electrode 305 has a convex part corresponding to the concave part. Therefore, the convex part of the conductive layer 305 (BL) is arranged medial to the insulating layer 303 in the x direction with respect to the cell end.

<Manufacturing Method>

The manufacturing method is basically the same as in each of the above embodiments and therefore a detail explanation will be omitted.

<Operational Advantages>

The semiconductor memory device of the fifth embodiment and the method of manufacturing the same produce at least the same effect as that of item (1).

In addition, with the fifth embodiment, the conductive layer 302 and resistance change layer 304 are arranged so as to be retreated medial to the insulating layer 303 in the x direction with respect to the cell end. The resistance change layer 304 is formed only in a region in contact with the side of the conductive layer 302 in the concave part. Moreover, the conductive layer 305 (BL) is arranged medial to the insulating layer 303 in the x direction with respect to the cell end. Therefore, the conductive path formation region can be limited more than when the resistance change layer 304 makes contact with both the conductive layer 302 and insulating layer 303. Accordingly, cells can be miniaturized.

It goes without saying that, even if the configuration of the fifth embodiment is applied to the first to fourth embodiments, this can produce synergistic effects without canceling out each other's effects.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first insulating film having a first surface;
   a second insulating film having a second surface;
   a first interconnection provided between the first insulating film and the second insulating film;
   a second interconnection facing the first surface and the second surface, and intersecting with the first interconnection;
   a third interconnection facing the first surface and the second surface, and intersecting with the first interconnection;
   a first variable resistance layer having a third surface, the first variable resistance layer being provided between the first interconnection and the second interconnection; and
   a second variable resistance layer having a fourth surface, the second variable resistance layer being provided between the first interconnection and the third interconnection,
   wherein the third surface is arranged at a farther position from the second interconnection than positions of both the first surface and the second surface,
   wherein the fourth face is arranged at a farther position from the third interconnection than positions of both the first surface and the second surface.

2. The device according to claim 1, wherein the first variable resistance layer is provided between the first surface and the second interconnection, and the first variable resistance layer is provided between the second surface and the second interconnection.

3. The device according to claim 1, wherein both of the first and the second surfaces have a first portion and a second portion, the second portion is projected toward the second interconnection ascending from the first portion to the second portion.

4. The device according to claim 3, wherein the first surface and the second surface are inclined in the direction from the second portion to the first portion.

5. The device according to claim 1, wherein the third surface faces the first interconnection.

6. The device according to claim 1, wherein both of the first surface and the second surface have a first portion and a second portion, the second portion is projected toward the second interconnection with respect to the first portion.

7. A semiconductor memory device comprising:
   a first insulating film having a first surface;
   a second insulating film having a second surface;
   a first interconnection provided between the first insulating film and the second insulating film;
   a second interconnection is intersected with the first interconnection in a first direction;
   a variable resistance layer having a third surface provided between the first interconnection and the second interconnection;
   wherein both of the first surface and the second surface face the second interconnection in a second direction orthogonal to the first direction,
   wherein a first length between the third surface and the second interconnection in the second direction is longer than a second length between the first and second surfaces and the second interconnection in the second direction.

8. The device according to claim 7, wherein the variable resistance layer is provided between the first surface and the second interconnection, the variable resistance layer is provided between the second surface and the second interconnection.

* * * * *